United States Patent
Ho et al.

(10) Patent No.: US 9,412,595 B2
(45) Date of Patent: Aug. 9, 2016

(54) SYSTEMS AND METHODS FOR INTELLIGENT DISPATCHING FOR WAFER PROCESSING

(71) Applicant: Taiwan Semiconductor Manufacturing Company Limited, Hsinchu (TW)

(72) Inventors: Kuo-Yuan Ho, Hsinchu (TW); Li-Jen Chen, Hsinchu County (TW); Chih-Cheng Kao, Taipei (TW); Shih-Ting Zeng, Hsinchu (TW); Yi-Hsiung Lin, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 146 days.

(21) Appl. No.: 14/132,362

(22) Filed: Dec. 18, 2013

(65) Prior Publication Data

US 2015/0170917 A1 Jun. 18, 2015

(51) Int. Cl.
*H01J 37/317* (2006.01)
*G05B 19/00* (2006.01)
*H01L 21/265* (2006.01)

(52) U.S. Cl.
CPC ................ *H01L 21/265* (2013.01)

(58) Field of Classification Search
CPC ....... H01J 37/30; H01J 37/304; H01J 37/317; H01J 37/3171; G05B 19/00; G05B 19/02; G05B 19/04; G05B 19/0405
USPC ......... 250/492.2–492.22, 492.3; 700/95, 108, 700/112, 121
See application file for complete search history.

(56) References Cited

U.S. PATENT DOCUMENTS

| 6,965,116 B1* | 11/2005 | Wagner | H01J 37/3171 250/397 |
| 7,315,765 B1* | 1/2008 | Ranft | G05B 19/404 700/108 |
| 7,620,470 B1* | 11/2009 | Hickey | G05B 19/4184 700/100 |
| 7,720,559 B1* | 5/2010 | Stewart | G05B 19/4187 700/101 |
| 2005/0092939 A1* | 5/2005 | Coss, Jr. | H01J 37/3023 250/492.21 |

* cited by examiner

*Primary Examiner* — Jack Berman
*Assistant Examiner* — David E Smith
(74) *Attorney, Agent, or Firm* — Jones Day

(57) ABSTRACT

Systems and methods are provided for ion implantation. For example, ion implantation is performed using a first ion implant tool. At least one condition parameter associated with the first ion implant tool is dynamically obtained. Whether the first ion implant tool is in a first condition is determined based on the at least one condition parameter. Ion implantation is performed using a second ion implant tool based on the determination.

15 Claims, 7 Drawing Sheets

SYSTEMS AND METHODS FOR INTELLIGENT DISPATCHING FOR WAFER PROCESSING

FIELD

The technology described in this disclosure relates generally to material processing and more particularly to tools for material processing.

BACKGROUND

Semiconductor devices are often fabricated through multiple processes using different process tools. For example, ion implantation is a very complex and widely used process in the manufacture of integrated circuit devices. Ion implantation often involves incorporating dopant materials (e.g., arsenic or boron) into a wafer (e.g., a substrate) to form implant regions having a certain dopant concentration and profile. Usually, ion implantation processes are performed on a group or a batch of wafers. The number of wafers processed in each batch may vary depending on the ion implant tools used to perform the process.

DETAILED DESCRIPTION

Successful performance of ion implantation processes usually depends on a number of factors, e.g., implant dose, implant energy level, gas flow rates, current and voltage levels of a filament, number of scans, vacuum pressure, ion-beam-related parameters, etc. Ion implant tools are often adjusted or tuned (e.g., with respect to the above-noted factors) prior to performing an implantation process to produce desirable results. However, actual conditions of an ion implant tool are often unknown and unpredictable before the performance of the implantation process, which may result in inaccurate tuning, poor implantation quality, and sometimes interlocking of the tool.

Figure 1:
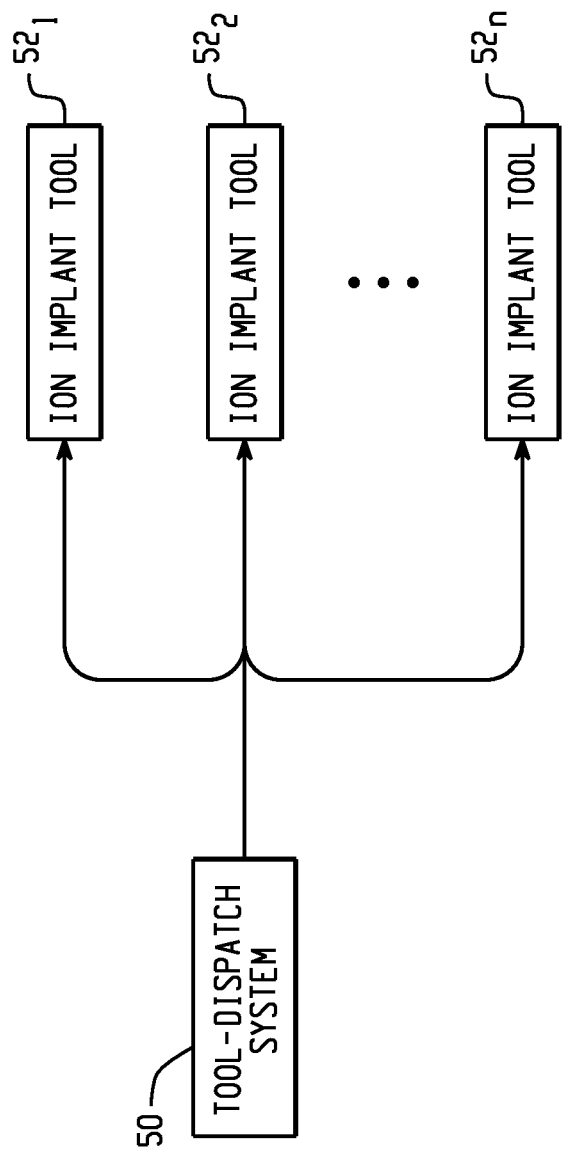
FIG. 1 depicts an example diagram showing a tool-dispatch system.

FIG. 1 depicts an example diagram showing a tool-dispatch system. As shown in FIG. 1, the tool-dispatch system 50 controls multiple ion implant tools $52_1, 52_2, \ldots, 52_n$. For example, the tool-dispatch system 50 collects performance-related data from different ion implant tools, and selects a particular ion implant tool for ion implantation (e.g., according to an ion-implant recipe) based at least in part on the performance-related data. In addition, the tool-dispatch system 50 determines initial condition parameters for the selected ion implant tool (e.g., according to an ion-implant recipe), and performs a tuning process for the selected ion implant tool before the performance of the implantation process. Furthermore, the tool-dispatch system 50 determines a condition score (e.g., a success rate) of the selected ion implant tool with respect to perform the implantation process (e.g., according to an ion-implant recipe). As an example, if the condition score is no lower than a threshold which indicates that the selected ion implant tool can perform the implantation process to produce desirable results, the tool-dispatch system 50 enables the selected ion implant tool to perform the implantation process according to the particular recipe. Otherwise, the tool-dispatch system 50 does not allow the selected ion implant tool to perform the implantation process according to the ion-implant recipe (e.g., until after a tool maintenance), and selects another ion implant tool instead.

Figure 2:
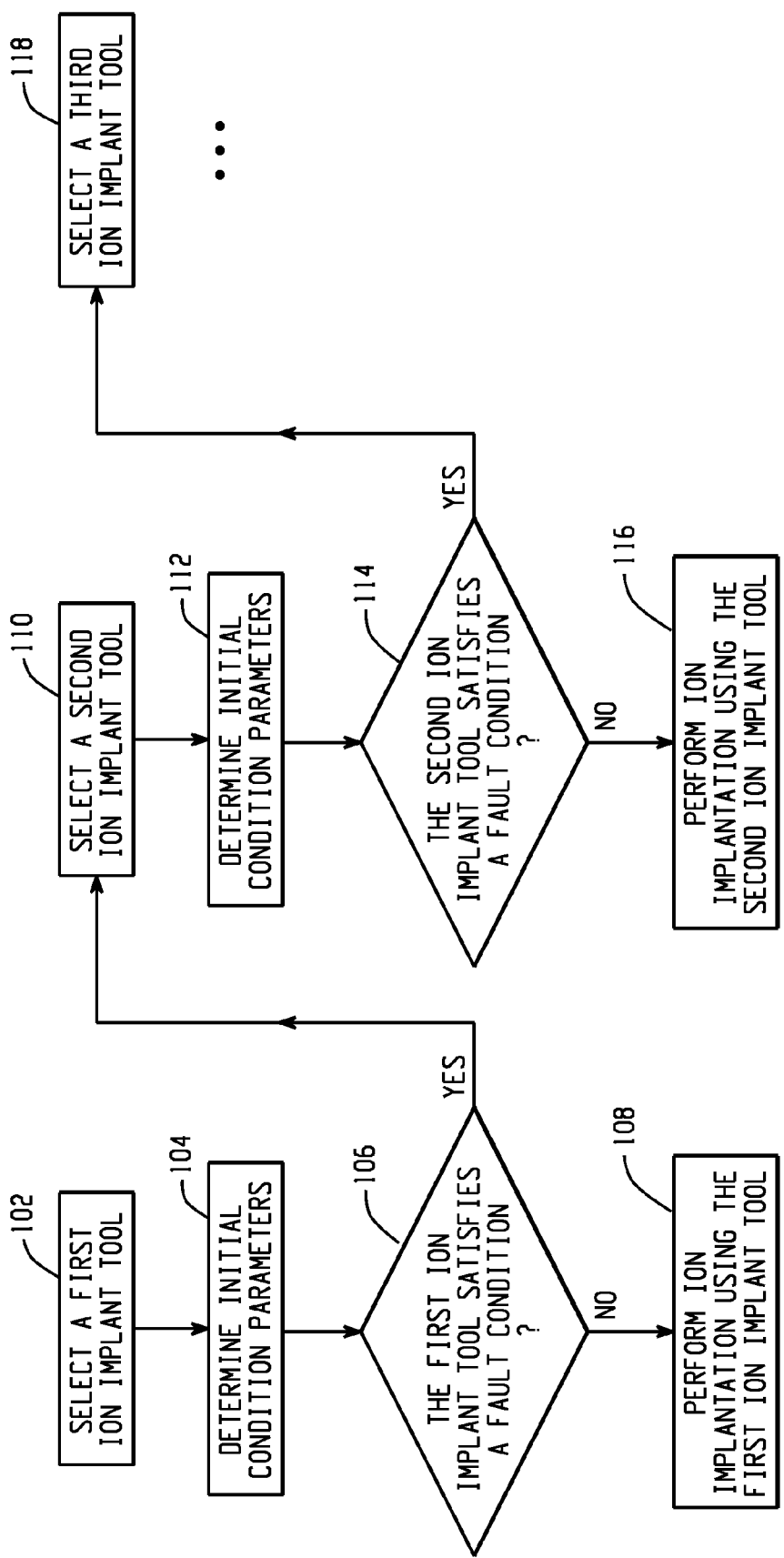
FIG. 2 depicts an example flow chart for intelligent selection of tools for ion implantation using a tool-dispatch system.

FIG. 2 depicts an example flow chart for intelligent selection of tools for ion implantation using the tool-dispatch system 50. As shown in FIG. 2, a first ion implant tool is selected for performing ion implantation (e.g., according to one or more ion-implant recipes) and whether the first ion implant tool satisfies a fault condition is determined. If the first ion implant tool satisfies a fault condition, a second ion implant tool is selected instead for performing ion implantation. Otherwise, the first ion implant tool is used to perform the ion implantation process.

Specifically, at 102, the first ion implant tool is selected for performing ion implantation (e.g., according to the one or more ion-implant recipes). At 104, one or more first initial condition parameters of the first ion implant tool are determined (e.g., dynamically). For example, the first initial condition parameters include: beam uniformity, beam glitch rate, beam height, beam angle spread, vacuum pressure, beam angle mean, beam stability, or other suitable parameters. The first initial condition parameters are determined based at least in part on data related to previous performance of ion implantation using the first ion implant tool according to the one or more ion-implant recipes. The data related to previous performance of ion implantation using the first ion implant tool includes: one or more process parameters related to the previous performance of ion implantation, one or more alarm messages indicating abnormal conditions of the first ion implant tool during the previous performance of ion implantation, tool-condition data of the first ion implant tool, or other suitable data.

At 106, whether the first ion implant tool satisfies the fault condition is determined. For example, a condition score is determined for the first ion implant tool based at least in part on the first initial condition parameters. If the condition score of the first ion implant tool is lower than a predetermined threshold, the first ion implant tool satisfies the first fault condition. A second ion implant tool is selected instead for performing the ion implantation process (e.g., according to the ion-implant recipes), at 110. On the other hand, if the condition score is no lower than the predetermined threshold, the first ion implant tool does not satisfy the first fault condition. The first ion implant tool is used to perform the ion implantation process (e.g., according to the one or more recipes), at 108. For example, a tuning process is performed for the first ion implant tool before the ion implantation process.

In some embodiments, similar to what is described with respect to the first ion implant tool, once the second ion implant tool is selected, one or more second initial condition parameters associated with the second ion implant tool are determined, at 112. Then, whether the second ion implant tool satisfies a second fault condition is determined based at least in part on the one or more second initial condition parameters, at 114. If the second ion implant tool satisfies the second fault condition, a third ion implant tool is selected instead for performing ion implantation, at 118. On the other hand, if the second ion implant tool does not satisfy the second fault condition, the second ion implant tool is used to perform the ion implantation process, at 116.

Figure 3:
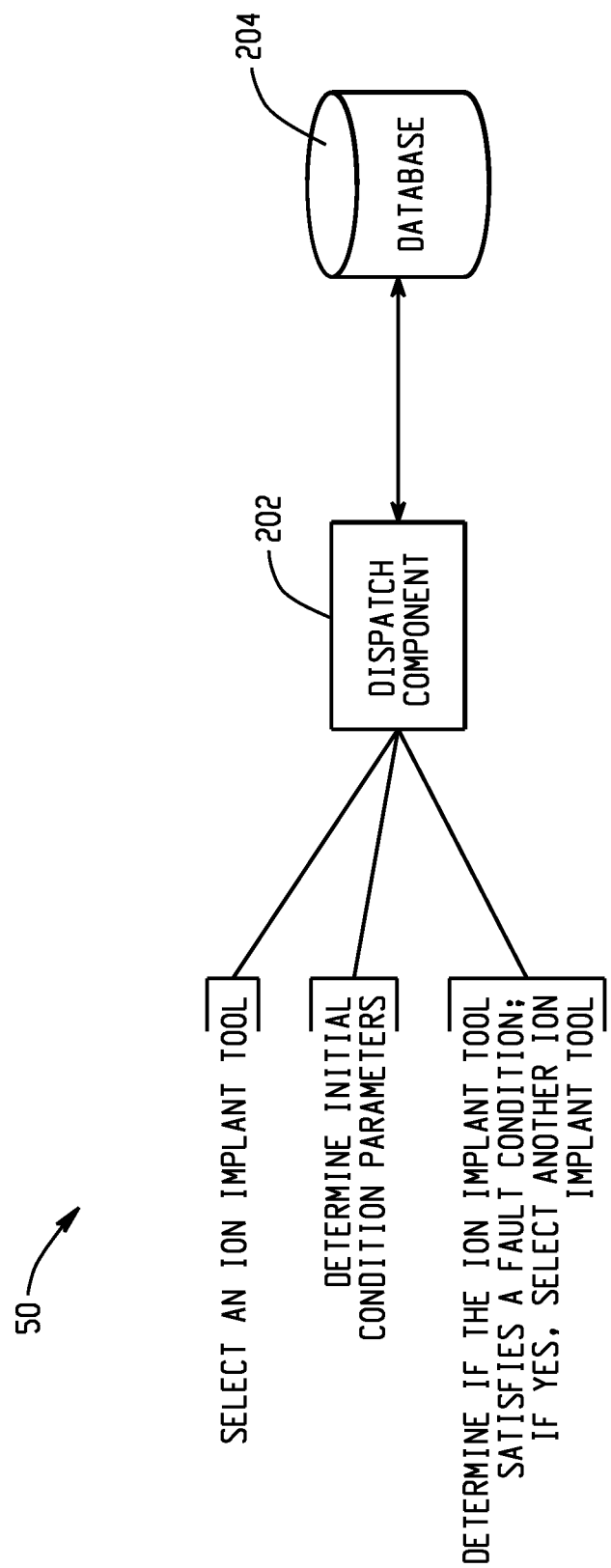
FIG. 3 depicts an example diagram showing certain components of a tool-dispatch system.

FIG. 3 depicts an example diagram showing certain components of the tool-dispatch system 50. As shown in FIG. 3, the tool-dispatch system 50 includes a dispatch component 202 and a data base 204. The database 204 is configured to store previous condition parameters (e.g., associated with one or more ion-implant recipes) related to multiple ion implant tools. The dispatch component 202 is configured to intelligently select an ion implant tool for performing ion implantation. As an example, the tool-dispatch system 50 further includes an auto-tuning component which is configured to perform a tuning process for the selected ion implant tool.

Specifically, the dispatch component 202 selects the ion implant tool for performing ion implantation (e.g., according to one or more ion-implant recipes) and determines (e.g., dynamically) initial condition parameters associated with the selected ion implant tool based at least in part on the previous condition parameters stored in the database 204. Furthermore, the dispatch component 202 determines whether the selected ion implant tool satisfies a fault condition based at least in part on the initial condition parameters. If the selected ion implant tool does not satisfy the fault condition, the dispatch component 202 enables the selected ion implant tool to perform the ion implantation process. For example, the dispatch component 202 is further configured to obtain one or more actual condition parameters during or after the performance of ion implantation using the first ion implant tool according to one or more ion-implant recipes. The database 204 is further configured to store the one or more actual condition parameters. On the other hand, if the selected ion implant tool satisfies the fault condition, the dispatch component 202 selects another ion implant tool for performing the ion implantation process.

Figure 4:
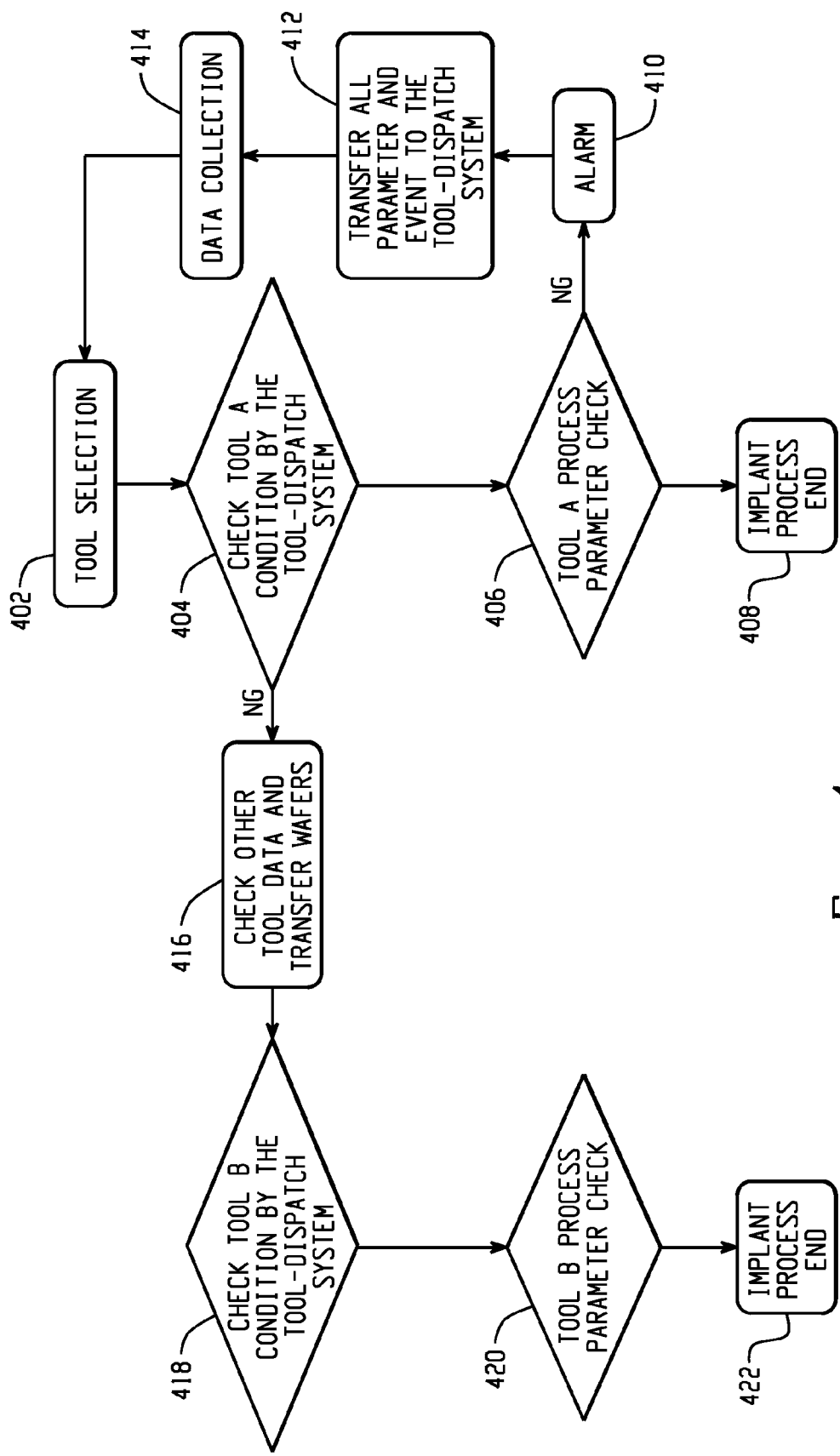
FIG. 4 depicts an example diagram showing another flow chart for intelligent selection of tools for ion implantation using a tool-dispatch system.

FIG. 4 depicts an example diagram showing another flow chart for intelligent selection of tools for ion implantation using the tool-dispatch system 50. At 402, an ion implant tool A is selected by the tool-dispatch system 50. At 404, the tool-dispatch system 50 checks initial conditions of the tool A (e.g., based on one or more initial condition parameters). If the initial conditions of the tool A are sufficient for performing ion implantation (e.g., according to a recipe) to produce desirable results, the tool A is used to perform the implantation process. At 406, actual condition parameters related to the performance of the implantation process are obtained. If the actual condition parameters are satisfactory (e.g., above certain thresholds), the implantation process ends, at 408. If the actual condition parameters are not satisfactory (e.g., below certain thresholds), an alarm is generated, at 410. For example, at 412, parameters and/or events related to the performance of the implantation process using the tool A are transferred to the tool-dispatch system 50. In addition, certain performance-related data are collected by the tool-dispatch system 50, at 414.

If the initial conditions of the tool A are insufficient for performing ion implantation (e.g., according to the recipe) to produce desirable results, other ion implant tools are checked by the tool-dispatch system 50, at 416. Wafers for ion implantation are transferred away from the tool A. For example, at 418, the tool-dispatch system 50 checks initial conditions of another tool B (e.g., based on one or more initial condition parameters of the tool B). If the initial conditions of the tool B are sufficient for performing ion implantation (e.g., according to the recipe) to produce desirable results, the tool B is used to perform the implantation process. At 420, actual condition parameters related to the performance of the implantation process using the tool B are obtained. If the actual condition parameters are satisfactory (e.g., above certain thresholds), the implantation process ends, at 422.

Figure 5:
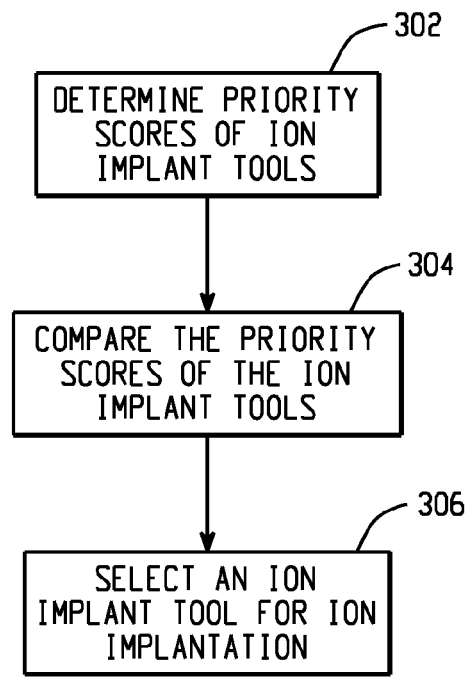
FIG. 5 depicts an example diagram showing a flow chart for selection of a tool using a tool-dispatch system.

FIG. 5 depicts an example diagram showing a flow chart for selection of a tool using the tool-dispatch system 50. At 302, the tool-dispatch system 50 determines priority scores associated with multiple ion implant tools. At 304, the tool-dispatch system 50 compares the priority scores associated with different ion implant tools. Then, the tool-dispatch system 50 selects an ion implant tool based at least in part on the comparison of the priority scores, at 306.

In some embodiments, a priority score of a particular ion implant tool (e.g., with respect to one or more ion-implant recipes) is determined based at least in part on performance data collected (e.g., during a three-day time period) for certain condition parameters, for example, beam uniformity, beam angle spread, beam glitch rate, etc. The tool-dispatch system 50 assigns a weight to each relevant condition parameter for calculating the priority score. As an example, a priority score of a particular ion implant tool is determined as follows:

$$P = 100 - (U \times 6 + BAS \times 1 + Glitch \times 3) \tag{1}$$

where P represents the priority score, U represents a beam-uniformity score, BAS represents a beam-angle-spread score, and Glitch represents a beam-glitch-rate score. In addition, the weights associated with the beam-uniformity score, the beam-angle-spread score, and the beam-glitch-rate score are 6, 1, and 3, respectively. For example, if there is no performance data being collected, the priority score has a default value (e.g., 76). If maintenance is performed on the ion implant tool, the priority score is set to 100, and different lots of the ion implant tool receive wafers for ion implantation according to a same recipe.

Figure 6:
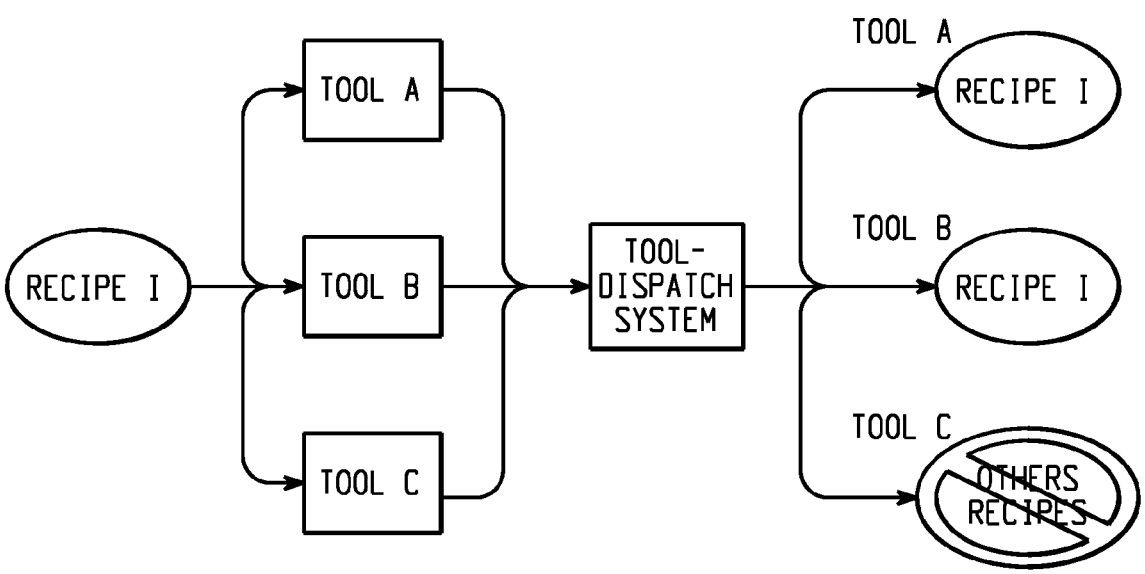
FIG. 6 depicts an example diagram showing priority score determination for different ion implant tools using a tool-dispatch system.

FIG. 6 depicts an example diagram showing priority score determination for different ion implant tools using the tool-dispatch system 50. As shown in FIG. 6, for recipe I, three tools A, B and C are evaluated by the tool-dispatch system 50. In some embodiments, certain thresholds are set for determining the priority of the ion implant tools with respect to the recipe I. For example, if the priority score of the tool A is determined (e.g., according to Equation (1)) to be above 80, the tool A has a top priority with respect to the recipe I. If the priority score of the tool B is between 60 and 80, the tool B has a second priority. Further, if the priority score of the tool C is below 60, the tool C cannot be used to perform ion implantation according to the recipe I. As an example, the tool A having a top priority with respect to the recipe I can be selected over other tools (e.g., tool B and tool C) to perform ion implantation according to the recipe I. The tool C may be suitable for other recipes.

In certain embodiments, alarms generated during the performance of the ion implantation process (e.g., as shown in FIG. 4) are used to adjust the priority score. For example, the priority score is reduced by a product of the number of the alarms and a weight (e.g., 30). Alarms may be generated under different circumstances, such as certain limits of the recipe being exceeded, errors associated with vacuum pressure, failure associated with orientation of wafers, etc.

Figure 7:
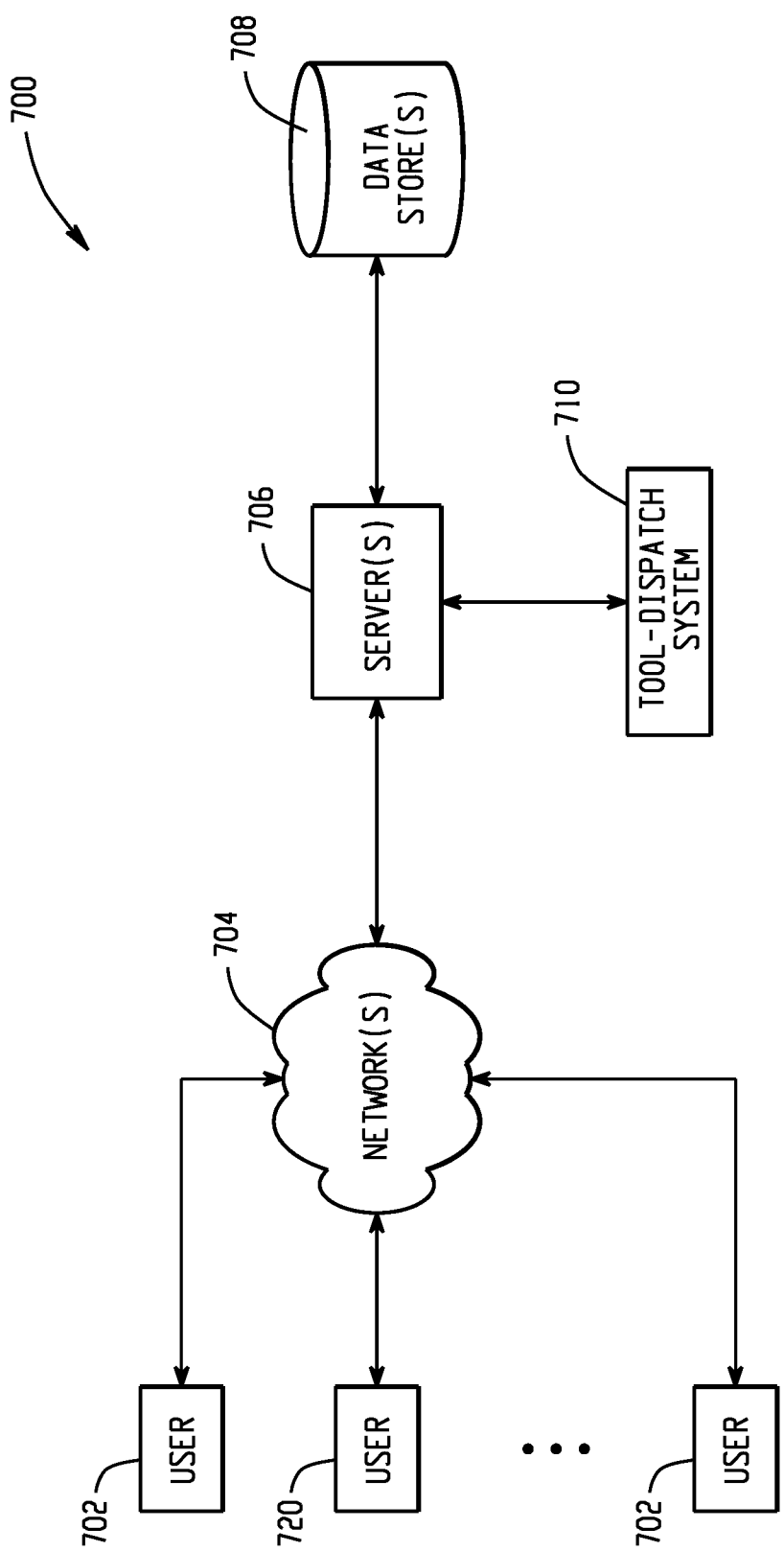
FIG. 7 illustrates an example of a computer-implemented environment wherein users can interact with a tool-dispatch system hosted on one or more servers through a network.

FIG. 7 illustrates an example of a computer-implemented environment wherein users 702 can interact with a tool-dispatch system 710 hosted on one or more servers 706 through a network 704. The tool-dispatch system 710 can assist the users 702 to select and monitor one or more process tools (e.g., ion implant tools). Specifically, the tool-dispatch system 710 is implemented to select an ion implant tool to perform ion implantation according to a recipe, and determines whether the ion implant tool satisfies a fault condition. Further, if the ion implant tool satisfies the fault condition, the tool-dispatch system 710 selects another ion implant tool instead.

As shown in FIG. 7, the users 702 can interact with the tool-dispatch system 710 through a number of ways, such as over one or more networks 704. One or more servers 706 accessible through the network(s) 704 can host the tool-dispatch system 710. The one or more servers 706 can also contain or have access to one or more data stores 708 for storing data for the tool-dispatch system 710. In some embodiments, the data stores 708 includes a database storing previous condition parameters associated with multiple ion implant tools, and the tool-dispatch system 710 queries the database to select the ion implant tool and determine the initial condition parameters for the ion implant tool.

Figure 8:
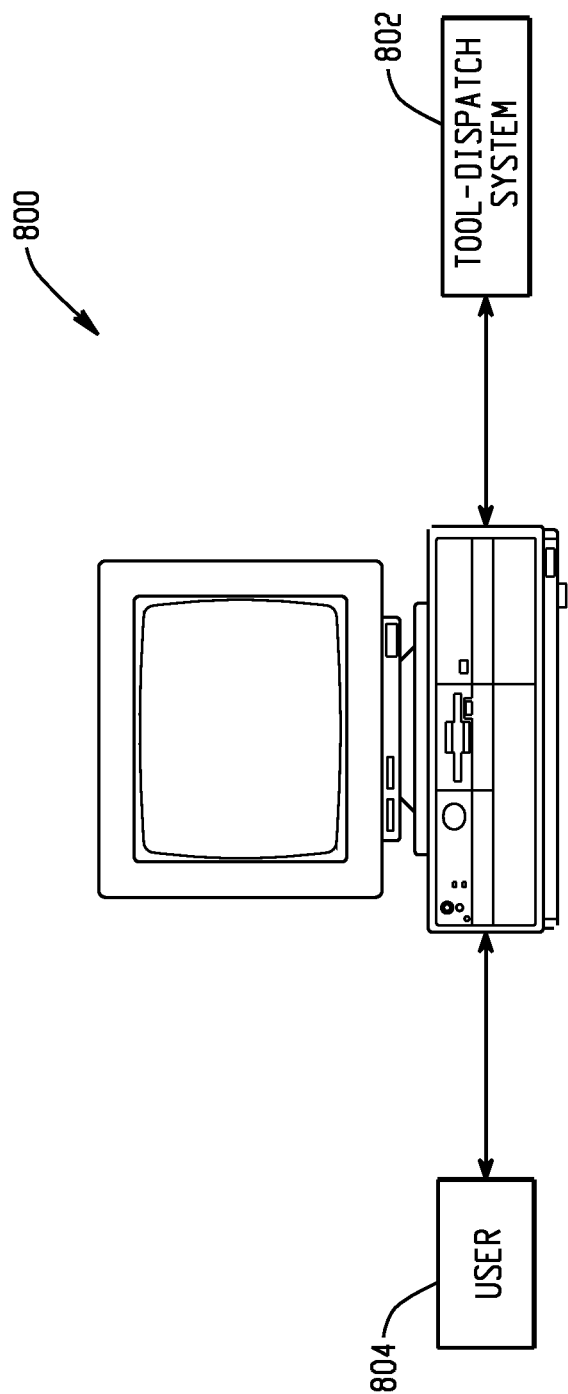
FIG. 8 depicts an example of a tool-dispatch system provided on a stand-alone computer for access by a user.

In some embodiments, a computer-implemented system and method can be configured such that a tool-dispatch system 802 can be provided on a stand-alone computer for access by a user, such as shown at 800 in FIG. 8.

According to one embodiment, a method is provided for ion implantation. For example, ion implantation is performed using a first ion implant tool. At least one condition parameter associated with the first ion implant tool is dynamically obtained. Whether the first ion implant tool is in a first condition is determined based on the at least one condition parameter. Ion implantation is performed using a second ion implant tool based on the determination.

According to another embodiment, a system includes: a database and a controller. The database is configured to store a plurality of condition parameter sets associated with a plurality of ion implant tools, wherein each of the condition parameters corresponds to one of the ion implant tools. The controller is configured to: select a first ion implant tool from a plurality of ion implant tools for performing ion implantation, obtaining at least one condition parameter associated with the first ion implant tool, determine whether the first ion implant tool is in a first condition based on the at least one first condition parameter, and selecting a second ion implant tool from the ion implant tools for performing ion implantation based on the determination.

According to yet another embodiment, a non-transitory computer readable storage medium includes programming instructions for performing ion implantation. The programming instructions are configured to cause one or more data processors to execute certain operations. For example, a first ion implant tool is selected from a plurality of ion implant tools for performing ion implantation. At least one condition parameter associated with the first ion implant tool is obtained. Whether the first ion implant tool is in a first condition is determined based on the at least one first condition parameter. A second ion implant tool is selected from the ion implant tools for performing ion implantation based on the determination.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope or of what may be claimed, but rather as descriptions of features specific to particular embodiments. Certain features that are described in this specification in the context or separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments have been described. Other embodiments are within the scope of the following claims. For example, the actions recited in the claims can be performed in a different order and still achieve desirable results.

What is claimed is:

1. A method comprising:
    performing ion implantation using a first ion implant tool and a second ion implant tool;
    obtaining, for each of the first and second ion implant tools, condition parameters comprising at least (i) a beam uniformity metric for an ion beam of the implant tool, (ii) a beam angle spread metric for the ion beam, and (iii) a rate of glitches for the ion beam, wherein each of the condition parameters is based on performance data for the respective ion implant tools collected over a predetermined time period;
    assigning, using a tool dispatch system that controls the first and second ion implant tools, a numerical weight to each of the condition parameters;
    generating a score for each of the first and second ion implant tools, the score being based on a weighted sum of the condition parameters for the ion implant tool, wherein each of the condition parameters is weighted based on its respective assigned numerical weight;
    comparing the scores for the first and second ion implant tools;
    selecting one of the first and second ion implant tools to perform an ion implantation task based on the comparison;
    determining whether the selected ion implant tool satisfies a fault condition based on the score for the selected ion implant tool;
    based on a determination that the selected ion implant tool does not satisfy the fault condition, performing the ion implantation task with the selected ion implant tool; and
    based on a determination that the selected ion implant tool satisfies the fault condition, selecting another ion implant tool to perform the ion implantation task.

2. The method of claim 1, further comprising:
    selecting one ion implant tool from a plurality of ion implant tools as the second ion implant tool.

3. The method of claim 1, wherein performing ion implantation using the selected ion implant tool includes:
    performing a tuning process for the selected ion implant tool based on the condition parameters of the selected ion implant tool.

4. The method of claim 1, wherein determining whether the selected ion implant tool satisfies the fault condition includes:
    comparing the score for the selected ion implant tool to a predetermined threshold.

5. The method of claim 1, wherein:
    the condition parameters are associated with a particular ion-implant recipe.

6. The method of claim 1, wherein the condition parameters further include at least one of: at least one process parameter of the ion implant tool, at least one alarm message indicating at least one abnormal condition of the ion implant tool, and at least one tool-condition parameter of the ion implant tool.

7. The method of claim 1, further comprising:
    determining, for each of the first and second ion implant tools, a priority score set, wherein the selection of one of the first and second ion implant tools is based on the priority score sets.

8. The method of claim 7, further comprising:
    adjusting the priority score set associated with the selected ion implant tool.

9. A system comprising:
    a database configured to store condition parameters for each of a first ion implant tool and a second ion implant tool, the condition parameters for an ion implant tool comprising at least (i) a beam uniformity metric for an ion beam of the ion implant tool, (ii) a beam angle spread metric for the ion beam, and (iii) a rate of glitches for the ion beam, wherein each of the condition parameters is based on performance data for the respective ion implant tools collected over a predetermined time period;
    a controller coupled to the database and configured to:
    obtain, for each of the first and second ion implant tools, the condition parameters from the database;
    assign a numerical weight to each of the condition parameters;
    generate a score for each of the first and second ion implant tools, the score being based on a weighted sum of the condition parameters for the ion implant tool, wherein each of the condition parameters is weighted based on its respective assigned numerical weight;
    compare the scores for the first and second ion implant tools;
    select one of the first and second ion implant tools to perform an ion implantation task based on the comparison; and
    determine whether the selected ion implant tool satisfies a fault condition based on the score for the selected ion implant tool, wherein another ion implant tool is selected to perform the ion implantation task based on a determination that the selected ion implant tool satisfies the fault condition.

10. The system of claim 9, wherein the controller is further configured to: select one ion implant tool from a plurality of ion implant tools as the second ion implant tool.

11. The system of claim 9, wherein the controller is further configured to: perform a tuning process for the selected ion implant tool based on the condition parameters of the selected ion implant tool.

12. The system of claim 9, wherein the controller is further configured to: store the condition parameters to the database.

13. The system of claim 9, wherein:
    the condition parameters associated with the ion implant tools are determined based on previous performances of the ion implant tools.

14. The system of claim 9, wherein the condition parameters further include at least one of: at least one process parameter of the corresponding ion implant tool, at least one alarm message indicating at least one abnormal condition of the corresponding ion implant tool, and at least one tool-condition parameter of the corresponding ion implant tool.

15. A non-transitory computer readable storage medium comprising programming instructions for performing ion implantation, the programming instructions configured to cause one or more data processors to execute operations comprising:
    obtaining, for each of a first ion implant tool and a second ion implant tool, condition parameters comprising at least (i) a beam uniformity metric for an ion beam of the implant tool, (ii) a beam angle spread metric for the ion beam, and (iii) a rate of glitches for the ion beam, wherein each of the condition parameters is based on performance data for the respective ion implant tools collected over a predetermined time period;

assigning a numerical weight to each of the condition parameters;

generating a score for each of the first and second ion implant tools, the score being based on a weighted sum of the condition parameters for the ion implant tool, wherein each of the condition parameters is weighted based on its respective assigned numerical weight;

comparing the scores for the first and second ion implant tools;

selecting one of the first and second ion implant tools to perform an ion implantation task based on the comparison;

determining whether the selected ion implant tool satisfies a fault condition based on the score for the selected ion implant tool; and based on a determination that the selected ion implant tool satisfies the fault condition, selecting another ion implant tool to perform the ion implantation task.

* * * * *